(12) United States Patent
Hoffman et al.

(10) Patent No.: US 6,326,908 B1
(45) Date of Patent: Dec. 4, 2001

(54) PRECISION POSITION ENCODER USING COARSE POSITION INDICATOR

(76) Inventors: David Hoffman, 16403 Locke Haven, Houston, TX (US) 77059; Bruce Beakley, 302 Lochnell Dr., Houston, TX (US) 77062

( * ) Notice: Subject to any disclaimer, the term of this patent is extended or adjusted under 35 U.S.C. 154(b) by 0 days.

(21) Appl. No.: 09/148,254

(22) Filed: Sep. 4, 1998

(51) Int. Cl.$^7$ .................................................. H03M 1/48
(52) U.S. Cl. ............................................................. 341/111
(58) Field of Search ........................... 341/111, 112, 341/113, 114, 116, 115

(56) References Cited

U.S. PATENT DOCUMENTS

| | | | |
|---|---|---|---|
| 3,597,643 | 8/1971 | Bregeault et al. | 310/10 |
| 4,070,665 | 1/1978 | Glennon et al. | 340/347 |
| 4,119,958 | 10/1978 | Simon et al. | 340/347 |
| 4,259,628 | 3/1981 | Iwakane et al. | 318/799 |
| 4,270,074 | 5/1981 | Duckworth et al. | 318/254 |
| 4,303,984 | 12/1981 | Houvig | 364/571 |
| 4,357,569 | 11/1982 | Iwakane et al. | 318/721 |
| 4,415,844 | 11/1983 | Mendenhall et al. | 318/254 |
| 4,481,596 | 11/1984 | Townzen | 364/571 |
| 4,499,547 | 2/1985 | Inuiya et al. | 364/571 |
| 4,669,052 | 5/1987 | Bianco | 364/571 |
| 4,758,787 | 7/1988 | Howley | 324/161 |
| 4,771,237 | 9/1988 | Daley | 324/202 |
| 4,794,511 * | 12/1988 | Lundin | 341/116 |
| 4,843,291 | 6/1989 | Predina | 318/605 |
| 4,933,674 | 6/1990 | Gasperi et al. | 341/116 |
| 5,012,238 * | 4/1991 | Hayashi et al. | 341/115 |
| 5,041,829 * | 8/1991 | Garrett | 341/8 |
| 5,134,397 | 7/1992 | Eyerly et al. | 341/116 |
| 5,134,404 * | 7/1992 | Peterson | 341/116 |
| 5,493,216 | 2/1996 | Asa | 324/207.2 |
| 5,559,431 | 9/1996 | Sellen | 324/202 |
| 5,608,317 * | 3/1997 | Hollmann | 324/207.2 |
| 5,646,496 | 7/1997 | Woodland et al. | 318/632 |
| 5,677,686 * | 10/1997 | Kachi et al. | 341/8 |
| 5,747,952 | 5/1998 | Izawa et al. | 318/135 |
| 5,747,995 | 5/1998 | Spies | 324/207.2 |
| 5,760,562 | 6/1998 | Woodland et al. | 318/632 |
| 5,786,781 * | 7/1998 | Taniguchi | 341/111 |

OTHER PUBLICATIONS

Data Device Inc. Product Sheet for RDC–19220 Series, Resolver–to–Digital Converters ©1990, 1999, pp. 1–20.*
Analog Devices, Inc. Resolver–to–Digital Converter AD2S90 product sheet Rev. D, 1999 pp. 1–12.*

* cited by examiner

Primary Examiner—Howard L. Williams
(74) Attorney, Agent, or Firm—Patrick Stellitano

(57) ABSTRACT

Methods and apparatus are presented for precise measurement of mechanical position comprising combination of a plurality of coarse position signals to obtain substantial cancellation of spatial harmonics, generating a digital course position from a resolver system responsive to non-time harmonic signals, and providing precise incremental position signals from memory locations addressed by digital coarse position words.

38 Claims, 6 Drawing Sheets

PRECISION POSITION ENCODER USING COARSE POSITION INDICATOR

FIELD OF THE INVENTION

The present invention relates to precision position measurement of mechanical motion.

BACKGROUND OF THE INVENTION

A variety of methods have been developed for measurement of mechanical motion. For example, synchros and resolvers are low impedance devices that are used to generate analog signals representative of motor position and are capable of driving a synchro-to-digital converter which converts the analog signal to a digital signal representative of position for use in a servo system. These devices require an alternating current (AC) reference excitation signal. The time-phase difference between the excitation signals in the rotor and stator of these devices may be used to develop a position signal proportional to the angular position of the rotor with respect to the stator. This position signal is representative of the spatial phase angle of the motor and is ideally independent of the frequency and amplitude of the excitation signal. Undesirable effects that decrease the accuracy and precision of synchro/resolver position measurement systems are harmonic distortion, time-phase shifts due to capacitance, cable length, etc., and nonlinearities due to mechanical imperfections in the magnetics and windings of the synchro/resolver. Because of these practical limitations to the accuracy and precision of synchro-resolver devices, other types of position encoders are used where greater accuracy and precision are required.

Rotary position encoders achieve higher accuracy than synchro/resolver systems and are relatively economical. Typically, rotary encoders are comprised of chrome on glass and are highly invariant with temperature changes. Even higher accuracy can be achieved by converting rotary motion to linear motion using precision-machined mechanical devices. However, such linear encoders are costly and unsuitable for many applications. Optical position encoders can also provide high accuracy. However, these encoder require tight alignment tolerances and clean environments, making them expensive and difficult to implement. Magnetic linear encoders are less sensitive to alignment tolerances but are as expensive as optical encoders and require additional mounting bracketry.

What is needed is a relatively inexpensive method for measurement of mechanical position with high precision and accuracy that is easy to implement.

SUMMARY OF THE INVENTION

An object of the present invention is therefore to provide methods and apparatus for measurement of mechanical position with high precision and accuracy that are easy to implement and are inexpensive.

According to one aspect of the invention, a coarse position indicator generates one or more coarse position signals that are a function of mechanical position. A resolver system responsive to the coarse position signals generates a digital coarse position word that is representative of mechanical position. The resolver system can derive the digital coarse position word from coarse position signals that are functions only of position and are not carried by an AC reference excitation signal. The digital coarse position word derived from the resolver system addresses a memory location of a precision memory unit. The precision memory unit is calibrated so that each addressed memory location contains a position increment number which is used to form quadrature incremental position signals for use with dual channel position controls systems. The position increment number at each address indicates an incremental or null change in position corresponding to the digital coarse position signal which addresses the memory location wherein the increment number is stored.

A feature of the present invention is the ability to obtain precise mechanical incremental position measurements from a coarse indication of mechanical position. A coarse position indicator can be manufactured inexpensively and mounted without stringent alignment tolerances that are difficult to achieve, and without the necessity of expensive or sophisticated packaging to maintain a desired environment for correct operation. Thus, for example, a simple array of ordinary hall effect devices can be used to generate coarse position signals from which a precise position measurement can be obtained. Similarly a precise measurement can be obtained from coarse position signals obtained from low cost optical gratings, lightwave sources, and an array of lightwave sensors.

Another feature of the present invention is the ability to derive a digital position word from coarse position signals that are independent of any AC reference excitation signal. Thus, the coarse position signals can be non-time harmonic functions of position.

According to another aspect of the invention, the coarse position signals from an array of position sensors are combined to provide a more sinusoidal signal to enable a more precise position determination to be made. This is done by spatially arranging the sensors and combining their output signals to achieve substantial cancellation of harmonics, noise and DC offsets, as well as to substantially eliminate temperature drift effects.

These and additional features and advantages of the present invention will become further apparent and better understood with reference to the following detailed description and attached drawings.

DESCRIPTION OF PREFERRED EMBODIMENTS

Figure 1:
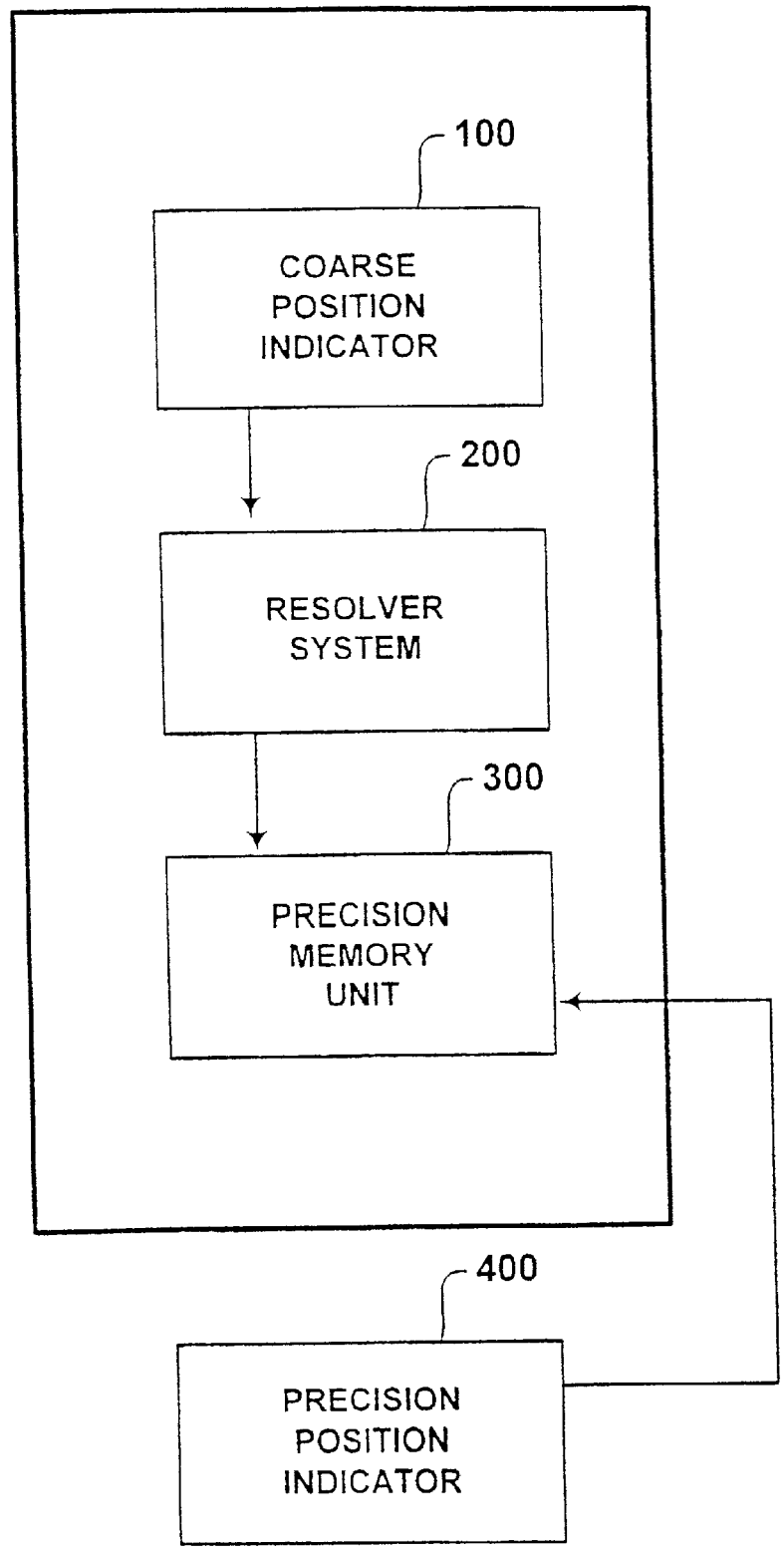
FIG. 1 is a functional diagram of an embodiment of the present invention.

A functional diagram of a preferred embodiment of the present invention is shown in FIG. 1. A coarse position indicator 100 generates one or more position signals that are a function of the mechanical position to be measured. If more than one signal is generated then multiple signals may be combined to reduce noise, DC offsets, temperature drift and other common-mode effects. The output of coarse position indicator 100 is applied to a resolver system 200. Resolver system 200 generates a digital coarse position signal in response to the input from coarse position indicator 100. The digital coarse position signal from resolver system 200 addresses a precision memory unit 300. Precision memory unit 300 is calibrated to store position increment numbers indicative of an incremental or null change in position corresponding to the digital coarse position word that addressed the memory location. The position increment numbers compensate for the error between the coarse position indicated by resolver system 200 and the precise position determined by a precise position indicator 400 used to calibrate precision memory unit 300. Methods for determining the position increment numbers to be stored in precision memory unit 300 will be described herein. It is a feature of the present invention that a coarse position signal can be used to generate a highly accurate and precise measurement of position as will be explained herein.

Coarse position indicator 100 is a device which generates one or more signals as a function of mechanical position. The particular implementation of coarse position indicator 100 will generally depend upon the measurement application. For example, for measuring the position of a motor with a permanent magnetic field, coarse position indicator 100 may comprise one or more analog hall effect devices (AHEDs). The AHEDs would be positioned to generate signals that are approximately sinusoidal functions of position of the moving member of the motor, as will be described below. Alternatively, coarse position indicator 100 may comprise an optical grating and lightwave sensors. The grating is stationary and the sensors are mechanically positioned to move with the moving member for which position is to be measured. The optical grating is scored so that the relative motion between the optical grating and the lightwave sensor causes the lightwave sensor to generate a signal that is approximately a sinusoidal function of position. When coarse position indicator 100 comprises an array of sensors, the waveforms generated by each sensor may be combined to produce signals that are more nearly sinusoidal in shape and in which noise, DC offset, and temperature drift effects are substantially reduced. These signals are combined to produce a transcendental function of position that may be resolved by resolver system 200.

Figure 2:
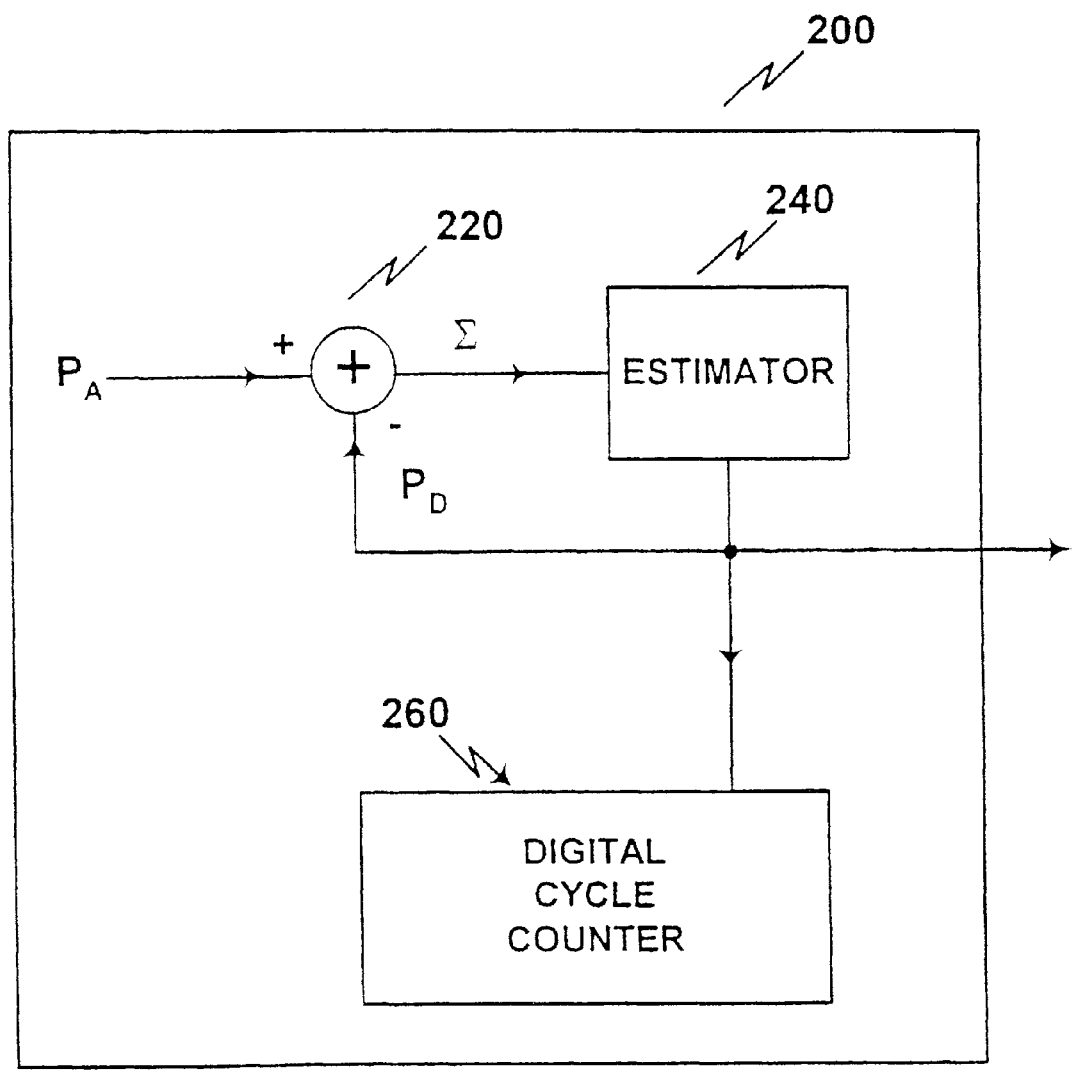
FIG. 2 is a functional diagram of a resolver system estimation loop.

The output of coarse position indicator 100 is input to resolver system 200. Resolver system 200 receives this output and generates a signal that is coarsely representative of position. A functional diagram of resolver 200 is shown in FIG. 2. The analog coarse position signal, $P_a$, is derived from the output of coarse position indicator 100 and is input to a summation device 220. Summation device 220 determines an error signal, $\epsilon$, which is the difference between the analog coarse position signal, $P_a$, and an estimated digital coarse position signal, $P_d$. Estimated digital coarse position signal, $P_d$, is derived in response to error signal, $\epsilon$, by an estimator, 240. Thus, resolver system 200 comprises a closed estimation loop which generates a digital coarse position word while driving the error signal, $\epsilon$, toward zero. Note that resolver system 200 may derive a digital position word from coarse position signals that are independent of any AC reference excitation signal. Thus, the coarse position signals can be non-time harmonic signals that are functions of position and random effects. It will be understood that the term "non-time harmonic" means that the coarse position signals are not harmonic functions of time, even though the coarse position signals will change in time during a time interval in which mechanical position changes. Resolver system 200 is preferably implemented using a commercially available analog error tracking servo device. In particular, at least one such device capable of deriving a digital position word from position signals without a reference excitation signal is an RDC-19222 from ILC Data Devices Corp. Alternatively, resolver system 200 may be implemented as a mixed signal application specific integrated circuit (ASIC), or may comprise a microprocessor or digital signal processor (DSP).

Figure 3:
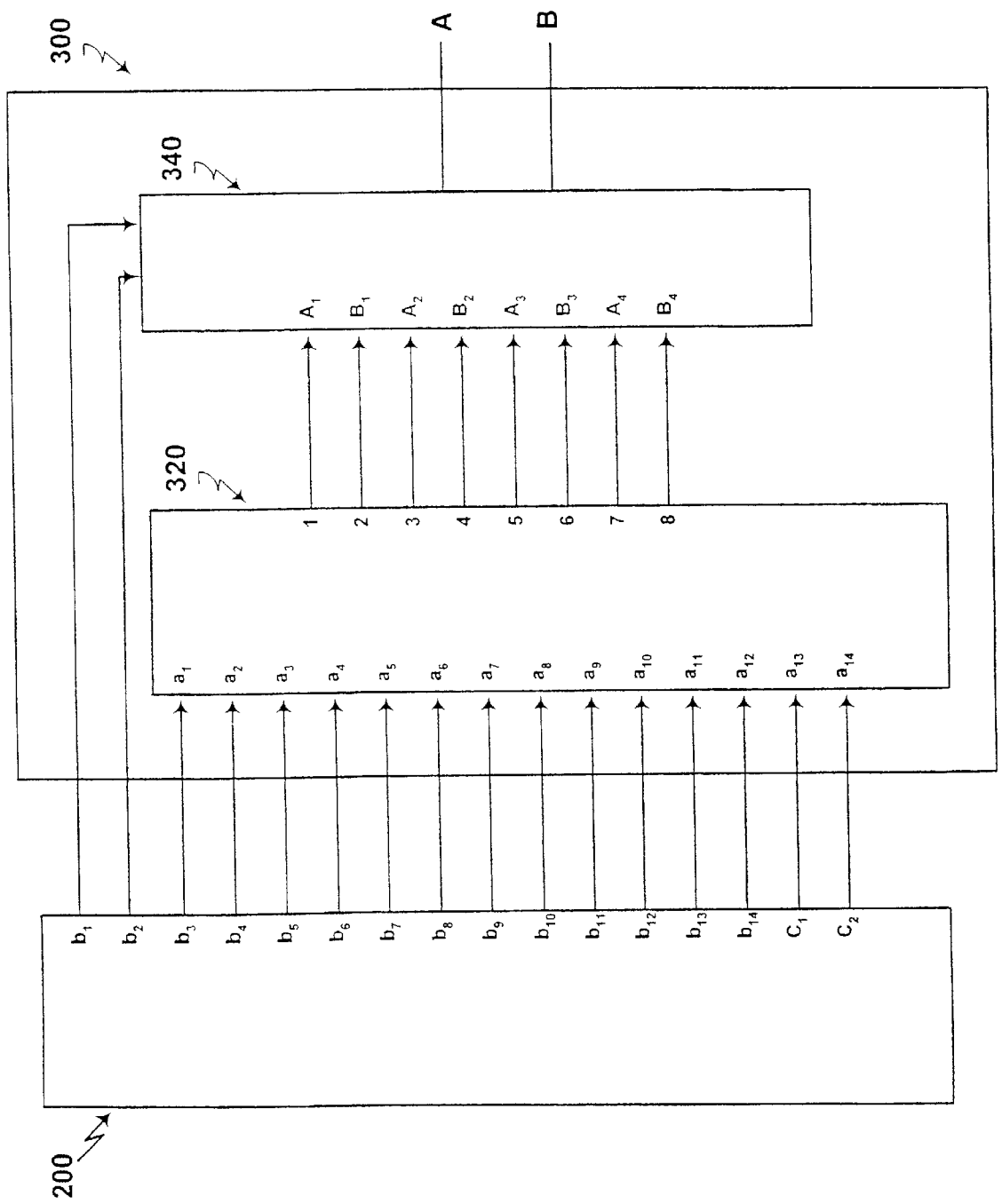
FIG. 3 is a block diagram of a precision memory unit.

Referring to FIG. 3, the digital coarse position word output from resolver system 200 is used to address precision memory unit 300. In a preferred embodiment, precision memory unit 300 comprises an addressable memory 320 and an addressable data selector 340. Addressable memory 320 is preferably an Electronically Erasable Programmable Read Only Memory (EEPROM). Addressable data selector 340 preferably comprises a complex programmable logic device (CPLD). The output of addressable memory 320 is an 8-bit word. Each 8-bit word is addressable by resolver system 200. The digital coarse position word output by resolver system 200 is preferably a 14-bit word. The 12 most significant bits, $b_3$ through $b_{14}$, of the digital coarse position word are connected to the 12 least significant bits, $a_1$ through $a_{12}$, of the address bus of addressable memory 320. The 8-bit word output by addressable memory 320 is input to addressable data selector 340. The 2 least significant bits, $b_1$ and $b_2$, of the digital course position word are also input to addressable data selector 340.

Referring to FIG. 3, bits $b_1$ and $b_2$ of the digital course position word select one of 4 pairs of bits $\{(A_1,B_1), (A_2,B_2), (A_3,B_3), (A_4,B_4)\}$ from the 8-bit word output by addressable memory 320. Each pair of bits comprises an A channel bit and a B channel bit. The A channel bit is output on an A channel and the B channel bit is output on a B channel. Thus, as the least two significant bits, $b_1$ and $b_2$, of the digital coarse position word from resolver system 200, transition through logic states $\{(0,0), (0,1), (1,0), (1,1)\}$, the A and B channels receive, respectively and in sequence, each pair of bits $\{(A_1,B_1), (A_2,B_2), (A_3,B_3), (A_4,B_4)\}$ in the 8-bit word output by addressable memory 320.

Figure 4:
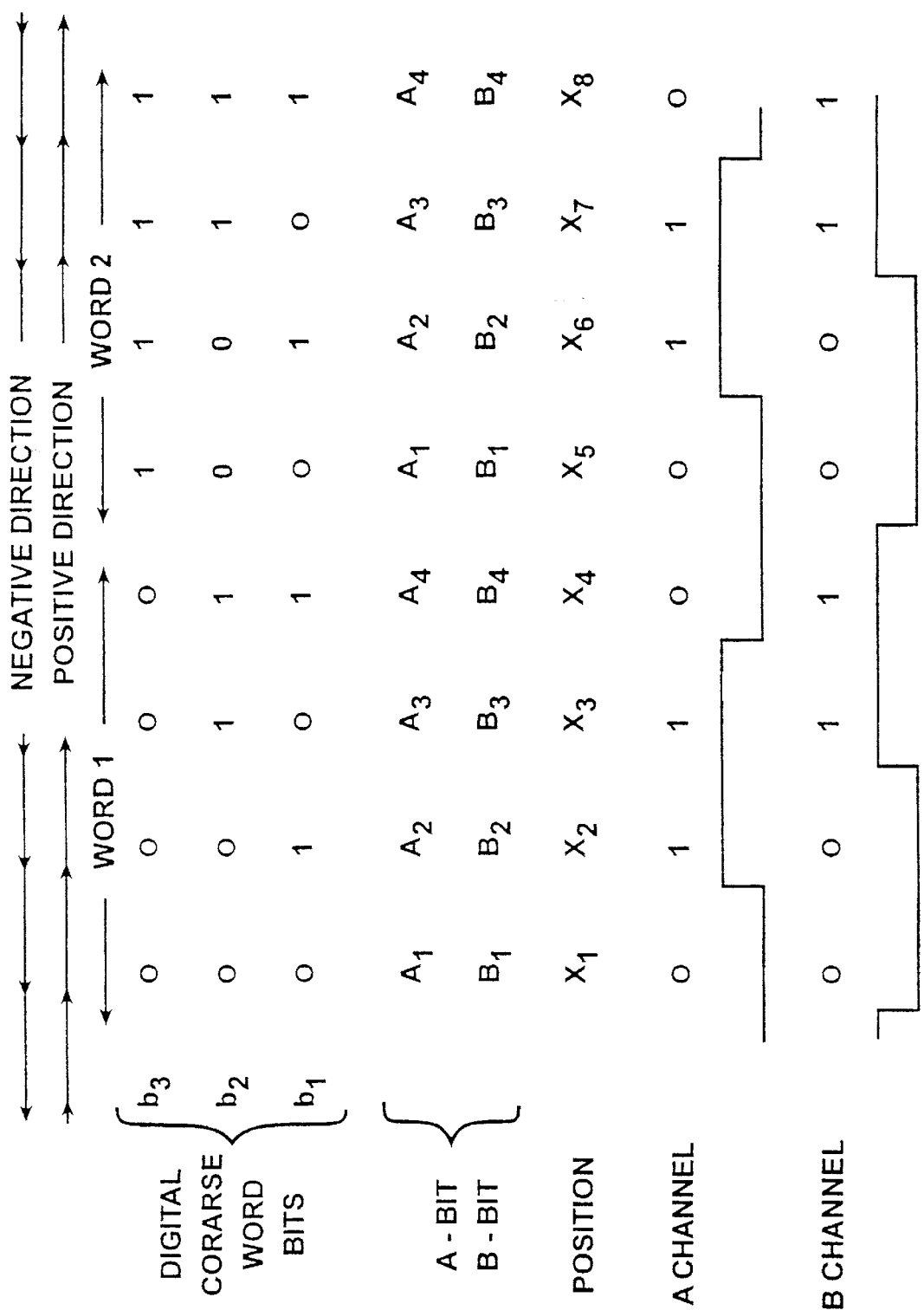
FIG. 4 illustrates relationships between digital position words, memory locations, increment numbers, and incremental position signals.

Each A bit and each B bit collectively form a single memory location containing a pair of position increment numbers. As each memory location is addressed, the A and B bits at the addressed location are placed on the A and B channels to provide quadrature incremental position signals that indicate an incremental or null change in position. This is illustrated in FIG. 4. FIG. 4 illustrates A and B channel signals for a set of sequential positions $x_1$ through $x_8$. Starting at a position $x_1$, assume motion in a single direction designated as a positive direction moving from left to right in FIG. 4. For position $x_1$, the lowest three bits of the digital coarse position word are (0,0,0) and an 8-bit word, say word 1, corresponding to $b_3$="0" is output from addressable memory 320 and is input to addressable data selector 340. With $b_1$="0" and $b_2$="0", the bits $A_1$="0" and $B_1$="0" are output onto the A and B channels. When mechanical position moves from $x_1$ to $x_2$, the digital course position word increases by one count. Data selector 340 outputs bits ($A_2$="1", $B_2$="0"), indicating an incremental change in position in one direction, which will here be denoted as the positive direction. As the digital coarse position word increases by another count, corresponding to a position $x_3$, data selector 340 outputs bits ($A_3$="1", $B_3$="1"), indicating an incremental change in position in the positive direction. This process continues until $b_3$ transitions from logic "0" to logic "1", causing a new 8-bit word to be output from addressable memory 320 and input to addressable data selector 340. Then, bits $b_1$ and $b_2$ transition through the counts $\{(0,0), (0,1), (1,0), (1,1)\}$ as position changes sequentially from $x_5$ to $x_8$. This places, in sequence, the bit pairs {$(A_1,B_1)$, $(A_2,B_2)$, $(A_3,B_3)$, $(A_4,B_4)$} onto the A and B channels, as shown in FIG. 4. If the direction of motion is in the negative direction, which is opposite the direction from left to right shown in FIG. 4, then bits $b_1$ through $b_3$ transition as shown in FIG. 4 moving from right to left and the A and B channel signals will appear as shown in FIG. 4 moving from right to left. If there is no change in position then the digital coarse position word should not change, and the output on the A and B channels will remain the same corresponding to the (A,B) pair being addressed.

In an ideal system where a digital position word is obtained that is as precisely representative of position as desired, each count of the digital position word will correspond to a distance, d, determined by the number of bits, m, of the digital position word and the displacement, c, to be represented by the digital position word:

$$d = c/2^m$$

In an ideal system, a motion of a distance, $\Delta y$, along the path of mechanical motion will produce a change in the digital position word of N counts. That is:

$$\Delta y = d*N$$

However, because the digital coarse position word output by resolver system 200 is only coarsely representative of position, a change in position from a point $y_a$ to the point $y_a + \Delta y$ will not generally produce the same number of counts as a change in position from a different point $y_b$ to the point $y_b + \Delta y$. Therefore, precision memory unit 300 must be calibrated to correct for the lack of accuracy and precision of the digital coarse position word. Precision memory unit 300 may be calibrated using a high precision position indicator 400 to obtain a highly precise measurement of mechanical position. Precision position indicator 400 may be implemented using any precision position measurement instrument that can measure mechanical motion with the desired degree of accuracy and precision. Once precision memory unit 300 is calibrated, precise position measurements can be made utilizing the coarse signals from coarse position indicator 100 as described herein without further need of precision position indicator 400.

Precision position indicator 400 is used to determine the precise distances between successive points along the direction of mechanical motion. For example, the distance between two positions, $y_n$ and $y_n + \Delta y$, may be measured by position indicator 400 to be a distance, $\Delta y$. Corresponding to these two successive positions, $y_n$ and $y_n + \Delta y$, resolver system 200 will output digital coarse position numbers $C_n$ and $C_{n+1}$, respectively. The difference between these two digital numbers will be a digital number that is equal to a number of counts, $M_n$, representing change in position as determined from the output of resolver system 200:

$$M_n = C_{n+1} - C_n$$

If each count corresponds to a distance, d, then the distance, $\delta y$, from $y_n$ to $y_n + \Delta y$ as indicated by resolver system 200 is:

$$\delta y = d*M_n$$

Thus, the difference between the change in position, $\delta y$, indicated by resolver system 200 and the change in position, $\Delta y$, indicated by precision position indicator 400 is:

$$\delta y - \Delta y = d*M_n - \Delta y$$

The number of counts, $\Delta M_n$, corresponding to this difference, is given by:

$$d*\Delta M_n = (\delta y - \Delta y)$$

Hence, $\Delta M_n$ is the number of counts in excess of the "correct" number of counts representing the change in position from $y_n$ to $y_n + \Delta y$, wherein the "correct" number of counts is the number of counts that would occur if the digital coarse position word output by resolver system 200 were as precise an indicator of position as obtained from precision position indicator 400.

On each count, the digital coarse position word addresses the next sequential memory location of precision memory unit 300. If every memory location addressed during the transition from $y_n$ to $y_n + \Delta y$ indicated a change in position, the aggregate change in position indicated by the incremental position signals on the A and B channels would be incorrect. Because there are $\Delta M_n$ extra counts, $\Delta M_n$ out of the $M_n$ memory locations addressed during the transition must indicate no change in position, so that the aggregate change in position indicated by the incremental position signals will be correct. This is accomplished by loading $\Delta M_n$ out of the $M_n$ memory locations with increment numbers that are identical to the increment numbers loaded in the preceding memory location. Apart from these $\Delta M_n$ pairs of adjacent memory locations that contain identical pairs of increment numbers, all other adjacent memory locations change by one bit from location to location to indicate an increment in position.

As an example, suppose $\Delta y = 0.05$ inch, as determined by precision position indicator 400, and the digital coarse position word is 14-bits and the total displacement, c, to be measured is 2.4". Then the nominal value of d is 3.72 microns per count:

$$d = 2.4/2^{14} = 3.72$$

Figure 5:
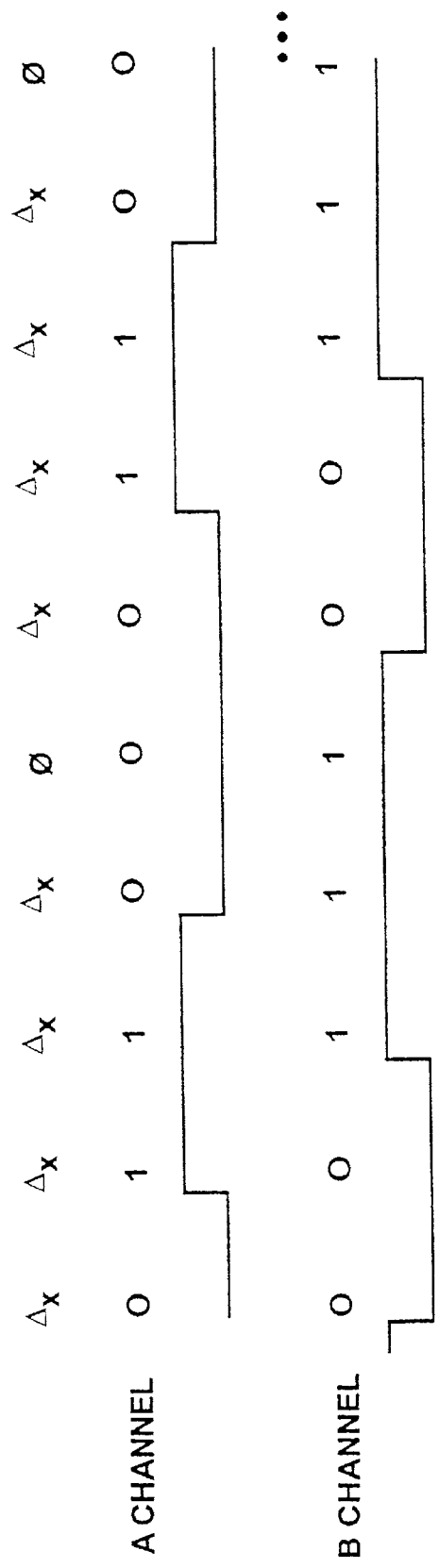
FIG. 5 illustrates incremental position signals loaded with null counts.

However, it may occur that the change in the number of counts, $M_n = C_n - C_{n+1}$, produced by resolver system 200 in a transition from a point $y_n$ to $y_n + \Delta y$ equates to a distance $3.72*M_n$ that is less than 0.05 inch. If this occurs it is necessary to choose a value of d that is greater than the nominal value, to ensure that $d*M_n \geq 0.05$ inch, for all $y_n$. This is necessary to ensure that $\Delta M_n \geq 0$. Suppose that d is chosen to be 4 microns per count. Then $\Delta y$ corresponds to about 318 counts. Suppose that because of errors, resolver system 200 changes by 400 counts. Then the excess number of counts is about 82. The fraction of excess counts is 82/400=20.5%. Thus, to calibrate precision memory unit 300, the memory locations corresponding to the transition from $y_n$ to $y_n + \Delta y$ must be loaded with increment numbers that indicate an incremental change in position for only 318 out of the 400 memory locations addressed. In other words, 82 out of the 400 memory locations must be loaded with null counts, i.e., with a pair of increment numbers that are identical to increment numbers loaded in the preceding memory location. It is desirable to distribute the 82 null counts as evenly as possible. This corresponds to about one null count out of every 5 counts. This distribution of increment numbers is illustrated in FIG. 5. In FIG. 5, the symbol $\Delta x$ indicates that the incremental position signals on the A and B channels correspond to a change in position, and the symbol, $\Phi$, indicates that the incremental position signals on the A and B channels correspond to a null change in position. Once precision memory unit 300 is calibrated, the A and B channels will always indicate change in position as precisely as determined from precision position indicator 400. Therefore, coarse position signals generated by coarse position indicator 100 are sufficient to provide high precision measurement of position.

As noted, coarse position indicator 100 may comprise an array of sensors. The signals generated by the sensors may be combined to provide a signal that is approximately a sinusoidal function of position. This is done by spatially arranging the sensors and combining their output signals to achieve substantial cancellation of harmonics, noise and DC offsets, as well as to substantially eliminate temperature drift effects. This enables resolver system 200 to develop a digital coarse position word that is more precisely representative of position. Ideally, a sensor will generate a signal, I, that is a perfect sinusoidal function of position:

$$I = B \sin(\theta)$$

$$\theta = 2\pi x/c$$

where B is the maximum amplitude of the signal, x is the position along the direction of displacement, and c is the distance corresponding to one complete cycle of the sinusoid. The number of cycles along the direction of displacement would be D/c, where D is the total displacement. For instance, a spatial phase angle of 60 degrees would correspond to a distance x=c/6. A spatial phase angle of 90 degrees would correspond to a distance x=c/4. If two sensors, $S_1$ and $S_2$, are separated along the direction of displacement by a spatial phase angle of 90 degrees, the signals from the sensors, in the ideal case would be:

$$I_1 = B \sin(\theta)$$

$$I_2 = B \cos(\theta)$$

for sensors $S_1$ and $S_2$ respectively. By forming the ratio of the sensor signals, $I_1/I_2=\tan(\theta)$, the spatial phase angle, $\theta$, can be determined, and therefore the displacement, x, can also be determined. Thus, the input to resolver system 200 would be $I_1$ and $I_2$. Resolver system 200 would therefrom derive a position signal $P_a$, proportional to $\theta$, which would be the input to summation device 220, to generate a digital coarse position word, as described above.

Figure 6:
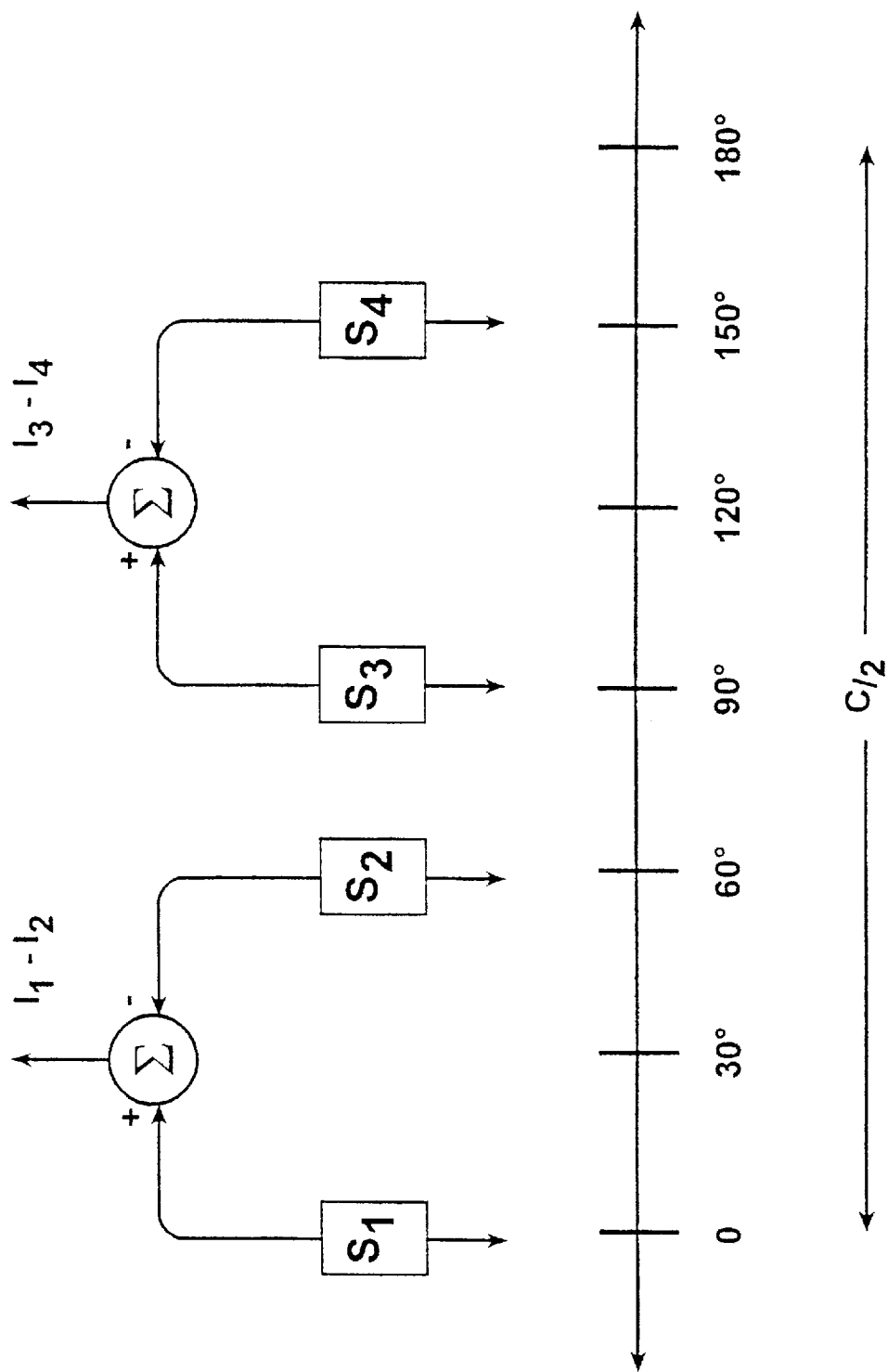
FIG. 6 illustrates a spatial relationship of an array of sensors.

Thus, in the ideal case, only two sensors would be required to determine position. However, for a variety of reasons, the signals developed by the sensors comprising coarse position indicator 100 will be periodic but not perfectly sinusoidal. This degrades the precision of the digital coarse position word generated by resolver system 200. To the extent that the signals developed by coarse position indicator 100 deviate from true sinusoids, the digital coarse position word may deviate from a precise indication of precision, resulting in an increase in the number of null counts that must be loaded into precision memory unit 300. This degrade resolution. Resolution can be improved substantially by using multiple sensors and combining their outputs in such a way as to substantially cancel harmonics of the non-sinusoidal periodic waveforms generated by the sensors. An illustration of an orientation of an array of sensors is shown in FIG. 6. Coarse position indicator 100 is comprised of a primary pair of sensors, $S_1$ and $S_3$, and a secondary pair of sensors, $S_2$ and $S_4$. The two primary sensors, $S_1$ and $S_3$, are placed in positions along the direction of displacement, separated by a spatial phase angle of 90 degrees. The two secondary sensors, $S_2$ and $S_4$, are also placed along the direction of displacement. Sensor $S_2$ is separated from sensor $S_4$ by a spatial phase angle of 90 degrees. Sensor $S_2$ is separated from sensor $S_1$ by a spatial phase angle of 60 degrees and is separated from sensor $S_3$ by a spatial phase angle of 30 degrees. Sensor $S_3$ is separated from sensor $S_4$ by a spatial angle of 60 degrees. Thus, the relative positions of the sensors are: sensor $S_1$ at 0 degrees, sensor $S_2$ at 60 degrees, sensor $S_3$ at 90 degrees, and sensor $S_4$ at 150 degrees. If the sensor outputs were sinusoidal, then the signals from the sensors may be represented as:

Sensor 1: $I_1 = b_{01} + B \sin(\theta) + N_1$

Sensor 2: $I_2 = b_{02} - B \sin(\theta - \pi/3) + N_2$

Sensor 3: $I_3 = b_{03} + B \cos(\theta) + N_3$

Sensor 4: $I_4 = b_{04} - B \cos(\theta - \pi/3) + N_4$ where the $b_0$ terms represent DC offsets, and the N terms represents noise. But since the outputs are not sinusoidal, the signals from the sensors may be represented as a Fourier series of spatial harmonic signals of the form:

$$I_{1n} = b_{n1} \sin(n\theta)$$

$$I_{2n} = -b_{n2} \sin(n(\theta - \pi/3))$$

$$I_{3n} = b_{n3} \cos(n\theta)$$

$$I_{4n} = -b_{n4} \cos(n(\theta - \pi/3))$$

where n=1, 2, 3, 4, 5, . . . and odd-symmetry is assumed for the signal from sensor $S_1$. If the sensors have nearly identical characteristics and can be adjusted to have nearly the same magnitude of DC offset, then the spatial harmonics of the sensors can be combined to yield:

$$I_{1n} - I_{2n} \approx 2b_n \sin(n\theta - n\pi/6)\cos(n\pi/6)$$

$$I_{3n} - I_{4n} \approx 2b_n \cos(n\theta - n\pi/6)\cos(n\pi/6)$$

Clearly, when n=3, 9, 15, 21, . . . , the right side of both of these expression are zero. Further, if the sensor signals exhibit half-wave odd symmetry, as is the case for triangular and square waves, only odd spatial harmonics are present. Therefore, these expressions are non-zero only for n=1, 5, 7, 11, etc. Moreover, if the sensor signals are already nearly sinusoidal, then the coefficients approach zero rapidly for increasing n. Under these conditions, which can be made to exist approximately for reasonably well-designed sensors, the expressions for the combined sensor signals become:

$$I_1 - I_2 \approx 2b_1 \sin(\theta) \cos(\pi/6) + N_1 - N_2$$

$$I_3 - I_4 \approx 2b_1 \cos(\theta) \cos(\pi/6) + N_3 - N_4$$

Note that by combining the sensor signals in this way, any DC offset will be substantially cancelled and common mode noise will also substantially cancel. Further, the remaining noise will be negligible in comparison to the amplitude of the combined signals. Thus, the signals may be combined to form the ratio:

$$R(\theta) = (I_1 - I_2)/(I_3 - I_4) \approx \tan(\theta)$$

Therefore, the inputs to resolver system 200 are $(I_1-I_4)$ and $(I_3-I_4)$. Resolver system 200 therefrom derives the digital course position word. It will be readily apparent to persons of ordinary skill in the art, given the disclosure herein, that additional sensors may be added, and their signals combined to achieve an even more sinusoidal waveform with cancellation of more spatial harmonics.

The methods described above may be applied in a variety of applications to achieve high precision measurements of mechanical motion. Consider, for example, the application of the present invention to the precise measurement of the position of a motor. In a preferred embodiment, coarse position indicator 100 comprises an array of Analog Hall Effect Devices (AHEDs) mounted on the moving member of a motor, i.e., the rotor of a conventional rotary motor or the moving armature of a linear motor. AHED sensors are well known in the art. An AHED sensor produces an analog voltage that is proportional to a magnetic field. When an AHED sensor is mechanically connected to the moving portion of the motor, the magnetic field detected by the AHED will be indicative of motor position. For example, for a rotary motor, an AHED attached to the rotor will generate a periodic waveform representative of the changing magnetic field detected by the AHED as the rotor rotates. Similarly, for a linear motor, an AHED attached to the sliding armature will generate a periodic waveform representative of the changing magnetic field detected by the AHED as the sliding armature moves. In the case of linear motors, it may be necessary to shape the permanent magnetic field of the motor by selective application of ferromagnetic material to provide a field that is more approximately sinusoidal.

Ideally, the magnetic field of a motor in the direction of displacement would vary sinusoidally as a function of position along the direction of displacement (which is angular for a rotary motor and linear for a linear motor). Each half-cycle of the sinusoid would correspond to a traversal along the direction of displacement equal to the distance from a north pole of the magnetic field to the corresponding south pole of the magnetic field. For example, if the distance between magnetic poles is c/2, then the ideal magnetic field, M, of the motor along the direction of displacement would be:

$$M = A \sin(\theta)$$

$$\theta = 2\pi x/c$$

However, for a variety of reasons, the magnetic field of a motor in the direction of displacement is not sinusoidal. For example, the magnetic flux from magnet to magnet typically varies to some extent. Also, the optimum alignment and positioning of the magnets is not always achieved. Motors produce a magnetic field that is only approximately sinusoidal. In particular, linear motors produce a field that may resemble a periodic triangular or trapezoidal or square waveform. Empirically, it has been determined that the magnetic field, $M_1$, of a linear motor may be described approximately by the formula:

$$M_1 \approx 1.1 \sin(\theta) + 0.1 \sin(3\theta)$$

where $M_1$ is normalized, and the coefficients of the sine terms will vary to some extent from motor to motor.

When the magnetic field is not truly sinusoidal the accuracy of the position determination deteriorates. Therefore, only a coarse determination of position can be made utilizing magnetic field sensors.

The determination can be improved substantially by using multiple sensors and combining their output signals as described above to cancel spatial harmonics of the non-sinusoidal periodic waveforms generated by the magnetic field of the motor. This is accomplished by spatially orienting the AHED sensors as described above for sensors $S_1$, $S_2$, $S_3$, and $S_4$, to obtain the signals $(I_1-I_2)$ and $(I_3-I_4)$. See FIG. 6. These signals are input to resolver system 200, which derives the digital coarse position word. The combined sensor signals, $(I_1-I_2)$ and $(I_3-I_4)$, can be obtained in a variety of ways by persons of ordinary skill in the art. For example, combination of the sensor signals can be accomplished using differential amplifiers or instrumentation amplifiers and associated circuitry.

In response to the signal from coarse position indicator 100, resolver system 200 generates a digital coarse position word coarsely representative of motor position. The digital coarse position word from resolver system 200 is representative of motor position, but generally will not represent motor position with the high degree of accuracy and precision required in many applications. In the case of a linear motor, where the motor traverses through multiple cycles of the magnetic field, resolver system 200 may further comprise a cycle counter 260, as shown in FIG. 2, to count the number of field cycles traversed by the moving member of the motor. The output of cycle counter 260 is a digital cycle word that is capable of indicating the total number of cycles along the direction of displacement. The digital cycle word addresses the bits of addressable memory 320 in conjunction with the digital coarse position word, as shown in FIG. 3, wherein the bits $c_1$ and $c_2$ are connected to address bits $a_{13}$ and $a_{14}$, respectively. Precision memory unit 300, is calibrated as described above using precision position indicator 400. The output of precision memory unit 300 are the A and B channel incremental position signals that provide the precise position information desired.

In an alternative embodiment, coarse position indicator 100 may comprise an optical grating and light sensors. Preferably, the optical grating is manufactured from inexpensive material that can be etched easily with a sinusoidal gray scale. The gray scale is made to vary from dark to light, or from non-reflective to very reflective, sinusoidally, along the direction of displacement. The grating is fixed relative to the motion to be measured. A light source generates a narrow beam of light that is modulated by the grating as a function of position. A lightwave sensor is used for detection of light modulated by the grating, and produces an electrical signal that is substantially a sinusoidal function of position. The degree to which the electrical signal is sinusoidal depends on the accuracy with which the grating is manufactured to produce sinusoidal modulation. Preferably, the main beam of transmission of the light source and the main axis of the lightwave sensor are substantially co-linear or are substantially parallel. The lightwave source and sensor may be mounted in a single package. Preferably two such lightwave source/sensor devices are mounted on the moving member for which motion is to be measured. Each source/sensor is separated by a spatial angle of 90 degrees to form a sine wave and a cosine wave for input into resolver system 200. Persons of ordinary skill in the art will readily recognize other methods for making optical gratings capable of reflecting, refracting, or defracting lightwaves to create a lightwave with an intensity that varies as a sinusoidal function of position with respect to the grating. The grating may be an inexpensive low quality grating since the methods of the present invention provides a high precision position measurement from a coarse position indication. Resolver system 200 produces a digital coarse position word as before in response to the signals from the lightwave sensors. Precision memory unit 300 is calibrated and addressed by the digital coarse position word, just as described above.

While this invention has been described with reference to the foregoing preferred embodiments, the scope of the invention is not limited by the foregoing written description. Rather, the scope of the present invention is defined by the following claims and equivalents thereof.

We claim:

1. A method for determining mechanical position comprising the steps of:

generating a plurality of analog signals each of which is a substantially periodic function of said position, wherein said analog signals are phase-shifted in relationship to each other;

deriving from said analog signals coarse digital position signals representative of said position; and obtaining from the coarse digital position signals addresses of an addressable memory of pre-calibrated position data to produce output signals representative of changes in position, wherein the pre-calibrated position data is derived from measurements obtained from a precision position indicator to compensate for errors in position represented by the coarse digital position signals.

2. The method of claim 1, wherein said analog signals are generated by a plurality of sensors disposed in a phase-shifted relationship to each other; and wherein signals generated by the sensors are combined to provide substantial cancellation of third order harmonics.

3. The method of claim 1, wherein said memory of pre-calibrated position data comprises data indicative of no change in position to compensate for errors in position represented by the coarse digital position signals.

4. The method of claim 3, wherein said analog signals are generated by a plurality of sensors disposed in a phase-shifted relationship to each other; and wherein signals generated by the sensors are combined to provide substantial cancellation of third order harmonics.

5. The method of claim 1, wherein deriving the pre-calibrated position data from the precision position indicator to compensate for errors in position represented by the coarse digital position signals comprises the steps of:

determining a change in position between two points as indicated by measurements obtained from the precision position indicator;

determining a first number of counts, M, corresponding to the change in position indicated by the precision position indicator;

determining a second number of counts, N, corresponding to the difference between a first coarse digital position signal representative of a first of the two points and a second coarse digital position signal representative of the second of the two points;

determining a number of excess counts, L=M−N, by determining the difference between the second number of counts and the first number of counts;

determining M sequentially addressable memory locations between a first memory address obtained from the first coarse digital position signal and a second memory address obtained from the second coarse digital position signal;

storing a position increment number corresponding to an incremental change in position in each of N of the M memory locations and storing a null count corresponding to no change in position in each of L of the M memory locations.

6. The method of claim 5, wherein the L memory locations are distributed substantially uniformly among the M memory locations.

7. The method of claim 5, wherein a first of the analog signals is phase-shifted from a second of the analog signals by a spatial phase angle of 60 degrees, and a difference is formed between the first and second signals to produce a signal that is a substantially sinusoidal function of position.

8. The method of claim 1, wherein the step of generating a plurality of analog signals further comprises the steps of:

providing a first signal, $I_1$;

providing a second signal, $I_2$, phase-shifted from the first signal by a spatial phase angle of 60 degrees;

providing a third signal, $I_3$, phase-shifted from the first signal by a spatial phase angle of 90 degrees and phase-shifted from the second signal by a spatial phase angle of 30 degrees;

providing a fourth signal, $I_4$, phase-shifted from the second signal by a spatial phase angle of 90 degrees and phase-shifted from the third signal by a spatial phase angle of 60 degrees;

deriving a first substantially sinusoidal signal by forming a difference between the first signal and the second signal;

deriving a second substantially sinusoidal signal by forming a difference between the third signal and the fourth signal.

9. The method of claim 8, further comprising the steps of forming a ratio of the first substantially sinusoidal signal to the second substantially sinusoidal signal to produce a signal substantially proportional to the tangent of a phase angle representative of said position.

10. A method for determining mechanical position of a moveable member of a motor comprising the steps of:

generating from an array of spatially oriented sensors a plurality of phase-shifted sensor signals each of which is a substantially periodic function of said position;

deriving coarse digital position signals from said sensor signals representative of said position; and obtaining from the coarse digital position signals addresses of an addressable memory of pre-calibrated position data to produce output signals representative of changes in position;

wherein the pre-calibrated position data is derived from measurements obtained from a precision position indicator to compensate for errors in position represented by the coarse digital position signals.

11. The method of claim 10, further comprising the step of:

counting a number of magnetic field cycles along a direction of displacement of the moveable member traversed by the moveable member.

12. The method of claim 10, wherein said memory of pre-calibrated position data comprises data indicative of no change in position to compensate for errors in position represented by the coarse digital position signals.

13. The method of claim 12, wherein sensor signals generated by the sensors are combined to provide substantial cancellation of third order harmonics.

14. The method of claim 13, wherein combining sensor signals to provide substantial cancellation of third order harmonics comprises the step of forming a difference between a first sensor signal and a second sensor signal phase-shifted from the first sensor signal by a spatial phase angle of 60 degrees.

15. The method of claim 10, wherein deriving the pre-calibrated position data from the precision position indicator to compensate for errors in position represented by the coarse digital position signals comprises the steps of:

determining a change in position between two points as indicated by measurements obtained from the precision position indicator;

determining a first number of counts, M, corresponding to the change in position indicated by the precision position indicator, determining a second number of counts, N, corresponding to the difference between a first coarse digital position signal representative of a first of the two points and a second coarse digital position signal representative of the second of the two points;

determining a number of excess counts, L=M−N, by determining the difference between the second number of counts and the first number of counts;

determining M sequentially addressable memory locations between a first memory address obtained from the first coarse digital position signal and a second memory address obtained from the second coarse digital position signal;

storing a position increment number corresponding to an incremental change in position in each of N of the M memory locations and storing a null count corresponding to no change in position in each of L of the M memory locations.

16. The method of claim 15, wherein the L memory locations are distributed substantially uniformly among the M memory locations.

17. The method of claim 15, wherein sensor signals generated by the sensors are combined to provide substantial cancellation of third order harmonics.

18. The method of claim 10, wherein the step of generating a plurality of sensor signals further comprises the steps of:

providing a first signal, I;

providing a second signal, $I_2$, phase-shifted from the first signal by a spatial phase angle of 60 degrees;

providing a third signal, $I_3$, phase-shifted from the first signal by a spatial phase angle of 90 degrees and phase-shifted from the second signal by a spatial phase angle of 30 degrees;

providing a fourth signal, $I_4$, phase-shifted from the second signal by a spatial phase angle of 90 degrees and phase-shifted from the third signal by a spatial phase angle of 60 degrees;

deriving a first substantially sinusoidal signal by forming a difference between the first signal and the second signal;

deriving a second substantially sinusoidal signal by forming a difference between the third signal and the fourth signal.

19. An apparatus for determining mechanical position, comprising:

a coarse position indicator for generating a plurality of analog signals each of which is a substantially periodic function of said position, wherein said analog signals are phase-shifted in relationship to each other;

a digital mechanism responsive to said analog signals for deriving coarse digital position signals representative of said position; and an addressable memory of pre-calibrated position data for producing calibrated output position signals according to values of the coarse digital position signals;

wherein the pre-calibrated position data is derived from measurements obtained from a precision position indicator to compensate for errors in position represented by the coarse digital position signals.

20. The apparatus of claim 19, wherein said coarse position indicator comprises:

a plurality of sensors disposed in a phase-shifted relationship to each other for generating said plurality of analog signals and wherein signals generated by the sensors are combined to provide substantial cancellation of third order harmonics.

21. The apparatus of claim 19, wherein said coarse position indicator comprises:

a plurality of light sources;

an optical grating for modulating the light from said plurality of light sources as a function of position; and a plurality of lightwave detectors for generating electrical signals responsive to said modulated light.

22. The apparatus of claim 19, wherein said memory of pre-calibrated position data comprises data indicative of no change in position to compensate for errors in position represented by the coarse digital position signals.

23. The apparatus of claim 22, wherein said coarse position indicator comprises:

a plurality of sensors disposed in a phase-shifted relationship to each other for generating said plurality of analog signals; and wherein signals generated by the sensors are combined to provide substantial cancellation of third order harmonics.

24. The apparatus of claim 19, wherein the pre-calibrated position data is derived from the precision position indicator to compensate for errors in position represented by the coarse digital position signals according to a method comprising the steps of:

determining a change in position between two points as indicated by measurements obtained from the precision position indicator;

determining a first number of counts, M, corresponding to the change in position indicated by the precision position indicator;

determining a second number of counts, N, corresponding to the difference between a first coarse digital position signal representative of a first of the two points and a second coarse digital position signal representative of the second of the two points;

determining a number of excess counts, L=M−N, by determining the difference between the second number of counts and the first number of counts;

determining M sequentially addressable memory locations between a first memory address obtained from the first coarse digital position signal and a second memory address obtained from the second coarse digital position signal;

storing a position increment number corresponding to an incremental change in position in each of N of the M memory locations and storing a null count corresponding to no change in position in each of L of the M memory locations.

25. The apparatus of claim 24, wherein the L memory locations are distributed substantially uniformly among the M memory locations.

26. The apparatus of claim 24, wherein a first of the analog signals is phase-shifted from a second of the analog signals by a spatial phase angle of 60 degrees, and a difference is formed between the first and second signals to produce a signal that is a substantially sinusoidal function of position.

27. The apparatus of claim 19, wherein said coarse position indicator comprises;

a first sensor for producing a first signal, $I_1$;

a second sensor for producing a second signal, $I_2$, phase-shifted from the first signal by a spatial phase angle of 60 degrees;

a third sensor for producing a third signal, $I_3$, phase-shifted from the first signal by a spatial phase angle of 90 degrees and phase-shifted from the second signal by a spatial phase angle of 30 degrees;

a fourth sensor for producing a fourth signal, $I_4$) phase-shifted from the second signal by a spatial phase angle of 90 degrees and phase-shifted from the third signal by a spatial phase angle of 60 degrees;

a combining mechanism for deriving a first substantially sinusoidal signal by forming a difference between the first signal and the second signal and for deriving a second substantially sinusoidal signal by forming a difference between the third signal and the fourth signal.

28. The apparatus of claim 19, wherein said coarse position indicator comprises an array of hall effect devices.

29. An apparatus for determining mechanical position of a moveable member of a motor, comprising:

an array of spatially oriented sensors for generating a plurality of phase-shifted sensor signals each of which is a substantially periodic function of said position;

a mechanism responsive to the sensor signals for deriving coarse digital position signals from said sensor signals; and a memory of pre-calibrated position data for obtaining from the coarse digital position signals output signals representative of changes in position of the moveable member;

wherein the pre-calibrated position data is derived from measurements obtained from a precision position indicator to compensate for errors in position represented by the coarse digital position signals.

30. The apparatus of claim 29 further comprising, a counter for counting a number of magnetic field cycles along a direction of displacement of the moveable member traversed by the moveable member.

31. The apparatus of claim 29, wherein said memory of pre-calibrated position data is addressed by the coarse digital position signals to produce the output signals.

32. The apparatus of claim 29, wherein said memory of pre-calibrated position data comprises data indicative of no change in position to compensate for errors in position represented by the coarse digital position signals.

33. The apparatus of claim 32, wherein the plurality of phase shifted sensor signals are combined to provide substantial cancellation of third order harmonics.

34. The apparatus of claim 29, wherein deriving the pre-calibrated position data from the precision position indicator to compensate for errors in position represented by the coarse digital position signals comprises the steps of:

determining a change in position between two points as indicated by measurements obtained from the precision position indicator;

determining a first number of counts, M, corresponding to the change in position indicated by the precision position indicator;

determining a second number of counts, N, corresponding to the difference between a first coarse digital position signal representative of a first of the two points and a second coarse digital position signal representative of the second of the two points;

determining a number of excess counts, L=M−N, by determining the difference between the second number of counts and the first number of counts;

determining M sequentially addressable memory locations between a first memory address obtained from the first coarse digital position signal and a second memory address obtained from the second coarse digital position signal;

storing a position increment number corresponding to an incremental change in position in each of N of the M memory locations and storing a null count corresponding to no change in position in each of L of the M memory locations.

35. The apparatus of claim 29, wherein the plurality of phase shifted sensor signals are combined to provide substantial cancellation of third order harmonics.

36. The apparatus of claim 29, wherein the array of spatially-oriented sensors comprises:

a first sensor for producing a first signal, $I_1$;

a second sensor for producing a second signal, $I_2$, phase-shifted from the first signal by a spatial phase angle of 60 degrees;

a third sensor for producing a third signal, $I_3$, phase-shifted from the first signal by a spatial phase angle of 90 degrees and phase-shifted from the second signal by a spatial phase angle of 30 degrees;

a fourth sensor for producing a fourth signal, $I_4$, phase-shifted from the second signal by a spatial phase angle of 90 degrees and phase-shifted from the third signal by a spatial phase angle of 60 degrees;

a combining mechanism for deriving a first substantially sinusoidal signal by forming a difference between the first signal and the second signal and for deriving a second substantially sinusoidal signal by forming a difference between the third signal and the fourth signal.

37. The apparatus of claim 36, further comprises a mechanism to form a ratio of the first substantially sinusoidal signal to the second substantially sinusoidal signal to produce a signal substantially proportional to the tangent of a phase angle representative of said position.

38. The method of claim 1, wherein said analog signals are generated by a coarse position indicator comprising:

a plurality of light sources;

an optical grating for modulating the light from said plurality of light sources as a function of position; and a plurality of lightwave detectors for generating electrical signals responsive to said modulated light.

* * * * *

UNITED STATES PATENT AND TRADEMARK OFFICE
CERTIFICATE OF CORRECTION

PATENT NO. : 6,326,908 B1
DATED : December 4, 2001
INVENTOR(S) : David Hoffman et al.

It is certified that error appears in the above-identified patent and that said Letters Patent is hereby corrected as shown below:

<u>Title page,</u>
Insert Item [73], to read -- Trilogy Systems Corporation, Webster TX --

Signed and Sealed this

Eleventh Day of June, 2002

Attest:

JAMES E. ROGAN
Attesting Officer    *Director of the United States Patent and Trademark Office*